United States Patent
Chen

(10) Patent No.: US 11,335,583 B2
(45) Date of Patent: May 17, 2022

(54) MASS TRANSFER METHOD AND DEVICE FOR MICRO LIGHT EMITTING DIODE CHIPS

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/026,675

(22) Filed: Sep. 21, 2020

(65) Prior Publication Data

US 2021/0098278 A1  Apr. 1, 2021

(30) Foreign Application Priority Data

Sep. 26, 2019 (CN) .......................... 201910918703.5

(51) Int. Cl.
*H01L 21/683* (2006.01)
*H01L 33/00* (2010.01)
(Continued)

(52) U.S. Cl.
CPC ...... *H01L 21/6835* (2013.01); *H01L 25/0753* (2013.01); *H01L 33/0093* (2020.05);
(Continued)

(58) Field of Classification Search
CPC ............. H01L 21/6835; H01L 33/0093; H01L 25/0753; H01L 33/62; H01L 2221/68354;
(Continued)

(56) References Cited

U.S. PATENT DOCUMENTS

2017/0326576 A1* 11/2017 Reid .................... H05K 3/0085
2017/0330867 A1   11/2017 Zou et al.
(Continued)

FOREIGN PATENT DOCUMENTS

CN  105493298 A  4/2016
CN  107425101 A  12/2017
(Continued)

OTHER PUBLICATIONS

Office Action for corresponding Chinese Application 201910918703.5 dated Apr. 29, 2020.
(Continued)

*Primary Examiner* — Vu A Vu
(74) *Attorney, Agent, or Firm* — ArentFox Schiff LLP; Michael Fainberg

(57) ABSTRACT

The disclosure provides a mass transfer method and device for micro light emitting diode chips. The method includes the following steps: performing magnetic pole electroplating on the micro light emitting diode chips obtained by peeling off the sapphire substrate to enable corresponding magnetic poles to be generated at corresponding positions of the micro light emitting diode chips; peeling off the transfer substrate, and placing the micro light emitting diode chips obtained by peeling off the transfer substrate in a dispersion liquid to form a solution in which micro light emitting diode chips are dispersed; and the display substrate picks up the micro light emitting diode chips dispersed under the action of the magnetic field force.

18 Claims, 5 Drawing Sheets

(51) Int. Cl.
*H01L 25/075* (2006.01)
*H01L 33/62* (2010.01)

(52) U.S. Cl.
CPC .... *H01L 33/62* (2013.01); *H01L 2221/68354* (2013.01); *H01L 2221/68363* (2013.01); *H01L 2221/68386* (2013.01); *H01L 2933/0066* (2013.01)

(58) Field of Classification Search
CPC . H01L 2221/68363; H01L 2221/68386; H01L 2933/0066; H01L 2224/95144; H01L 24/95; H01L 2221/68381; H01L 33/0095; H01L 21/67144
USPC .......................................................... 257/89
See application file for complete search history.

(56) References Cited

U.S. PATENT DOCUMENTS

| | | | |
|---|---|---|---|
| 2021/0005490 A1* | 1/2021 | Chen | H01L 33/00 |
| 2021/0005775 A1* | 1/2021 | Chen | H01L 21/67709 |

FOREIGN PATENT DOCUMENTS

| | | |
|---|---|---|
| CN | 107808835 A | 3/2018 |
| CN | 108682312 A | 10/2018 |
| CN | 208352323 U | 1/2019 |
| CN | 109671670 A | 4/2019 |
| CN | 110265424 A | 9/2019 |

OTHER PUBLICATIONS

Office Action for corresponding Chinese Application 201910918703.5 dated Jul. 22, 2020.

* cited by examiner

Patterning a photoresist on a side, where the micro light emitting diode chips are attached, of the transfer substrate obtained by peeling off the sapphire substrate to form a first photoresist patterned — S201

Depositing conductive layers in the area defined by the first photoresist to form electrodes for electroplating — S202

Placing the micro light emitting diode chips deposited the conductive layers in an electrolyte, and generating corresponding patterned magnetic poles at corresponding positions of the conductive layers depositing on the micro light emitting diode chips — S203

FIG. 3

MASS TRANSFER METHOD AND DEVICE FOR MICRO LIGHT EMITTING DIODE CHIPS

CROSS-REFERENCE TO RELATED APPLICATION

This application claims priority to Chinese Patent Application No. 201910918703.5, filed on Sep. 26, 2019, which is hereby incorporated by reference in its entirety.

FIELD

The present disclosure relates to the field of display technology, in particular to a mass transfer method and device for micro light emitting diode chips.

BACKGROUND

A micro light emitting diode (micro LED) chip is configured to display by miniaturizing and matrixing the traditional LED structure. Due to the advantages of small size, high resolution, high brightness, high luminous efficiency, low power consumption and the like, the micro LED chip has become the focus of research in the display field.

Wherein, how to transfer a large number of micro light emitting diode chips to a display substrate has become a major challenge for the mass transfer technology.

SUMMARY

Embodiments of the present disclosure provide a mass transfer method and device for micro light emitting diode chips, which are used to transfer a large number of micro light emitting diodes to a display substrate.

In a first aspect, an embodiment of the present disclosure provides a mass transfer method for micro light emitting diode chips, including:

bonding micro light emitting diode chips prepared on a sapphire substrate to a transfer substrate;

peeling off the sapphire substrate;

performing magnetic pole electroplating on the micro light emitting diode chips obtained by peeling off the sapphire substrate to enable corresponding magnetic poles to be generated at corresponding positions of the micro light emitting diode chips;

peeling off the transfer substrate;

placing the micro light emitting diode chips obtained by peeling off the transfer substrate in a dispersion liquid to form a solution including the micro light emitting diode chips dispersed in the dispersion liquid, wherein a respective one of the micro light emitting diode chips dispersed dispersion liquid includes a respective one of the magnetic poles;

forming soldering areas for accommodating the micro light emitting diode chips dispersed in the dispersion liquid on a display substrate; and placing the micro light emitting diode chips, which are dispersed in the dispersion liquid, in the soldering areas under an action of a magnetic field force.

Optionally, wherein the performing magnetic pole electroplating on the micro light emitting diode chips obtained by peeling off the sapphire substrate to enable the corresponding magnetic poles to be generated at the corresponding positions of the micro light emitting diode chips includes:

patterning a photoresist on a side, where the micro light emitting diode chips are attached, of the transfer substrate obtained by peeling off the sapphire substrate to form a first photoresist patterned;

depositing conductive layers in the area defined by the first photoresist to form electrodes for electroplating; and placing the micro light emitting diode chips deposited the conductive layers in an electrolyte, and generating corresponding patterned magnetic poles at corresponding positions of the conductive layers depositing on the micro light emitting diode chips.

Optionally, before placing the micro light emitting diode chips obtained by peeling off the transfer substrate in the dispersion liquid, the method further includes:

removing the first photoresist;

applying a second photoresist on surfaces of the patterned magnetic poles by spin coating; and after peeling off the transfer substrate, removing the second photoresist.

Optionally, wherein the forming soldering areas for accommodating the micro light emitting diode chips dispersed in the dispersion liquid on the display substrate includes:

disposing the soldering areas formed by a patternable viscous adhesive for accommodating the dispersed micro light emitting diode chips according to a preset interval on a base substrate of the display substrate.

Optionally, after forming the soldering areas for accommodating the dispersed micro light emitting diode chips dispersed in the dispersion liquid on the display substrate, the method further includes:

forming a magnetic field shielding layer on the display substrate, wherein the magnetic field shielding layer includes spaced openings for accommodating the soldering areas.

Optionally, the forming soldering areas for accommodating the micro light emitting diode chips dispersed in the dispersion liquid on a display substrate includes:

forming the soldering areas patterned in the openings.

Optionally, the method further includes:

forming a surface energy control layer at corresponding position of the magnetic field shielding layer.

Optionally, after forming the solution including the micro light emitting diode chips dispersed, the method further includes:

under actions of hydrophobicity of the surface energy control layer, hydrophilicity of the soldering areas, and magnetic field shielding of the magnetic field shielding layer, controlling the micro light emitting diode chips dispersed to move toward the soldering areas by the magnetic field force.

Optionally, after placing the micro light emitting diode chips, which are dispersed in the dispersion liquid, in the soldering areas, the method further includes:

curing the patternable viscous adhesive by a thermocuring process; and fixing the micro light emitting diode chips dispersed.

Optionally, the dispersion liquid includes one or more of a silane coupling agent, methacryloyloxy silicon or methanol.

Optionally, a pH value of the electrolyte is 3 to 4, a current density is 8 mA/cm$^2$, and an electroplating current duty cycle is 66.6%.

In a second aspect, an embodiment of the present disclosure provides a mass transfer device, configured to transfer micro light emitting diode chips dispersed peeling off from a transfer substrate to a display substrate according to the mass transfer method of the micro light emitting diode chips according to the method in the first aspect, wherein:

the transfer substrate is configured to bond the micro light emitting diode chips prepared on a sapphire substrate.

Optionally, the mass transfer device further includes a cavity containing a dispersion fluidized bed.

Optionally, the dispersion fluidized bed is methanol fluidized bed.

Optionally, a concentration of a dispersion liquid is 5 wt %-30 wt %.

Optionally, the display substrate is configured to pick up the micro light emitting diode chips dispersed under the action of the magnetic field force.

In a second aspect, an embodiment of the present disclosure provides a display panel, including:

a display substrate;

a magnetic field shielding layer formed on the display substrate, wherein the magnetic field shielding layer includes spaced openings;

soldering areas formed in the openings, wherein the soldering areas are formed of a patternable viscous adhesive; and a micro light emitting diode chip formed on each of the soldering areas;

a magnetic pole formed on a side of the micro light emitting diode chip away from the display substrate.

Optionally, the display panel further includes:

a surface energy control layer, which is hydrophobic, formed on a corresponding position of the magnetic field shielding layer.

Optionally, surfaces of the soldering areas are hydrophilic.

Optionally, the display panel further includes: a conductive layer between the micro light emitting diode chip and the magnetic pole.

BRIEF DESCRIPTION OF THE DRAWINGS

FIG. 3 is a method flowchart of S102 in the mass transfer method of the micro light emitting diode chips provided by an embodiment of the present disclosure.

DETAILED DESCRIPTION OF THE EMBODIMENTS

Figure 1:
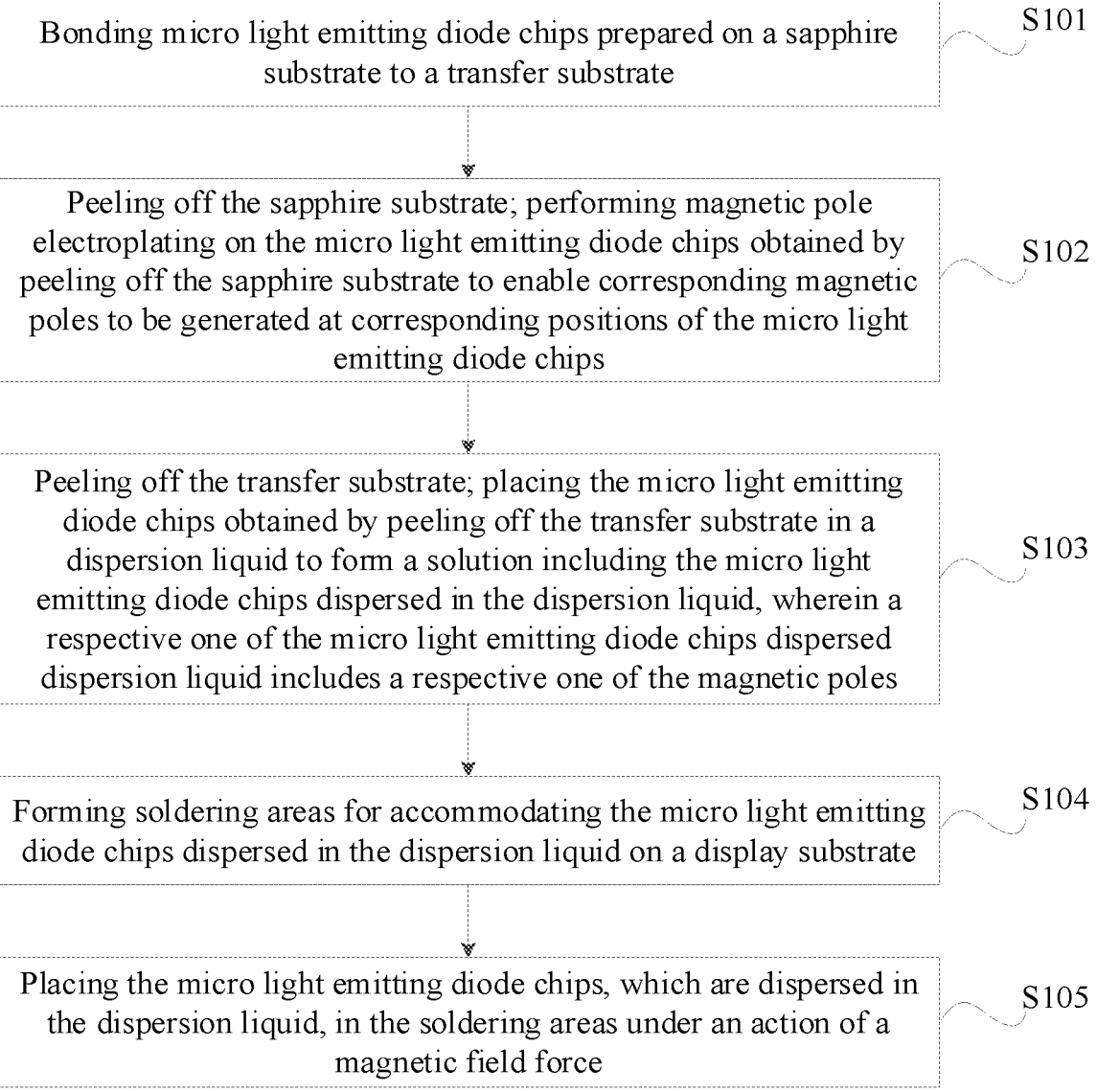
FIG. 1 is a method flowchart of a mass transfer method for micro light emitting diode chips provided by an embodiment of the present disclosure.

To make the objectives, technical solutions and advantages of the embodiments of the present disclosure clearer, the technical solutions of the embodiments of the present disclosure will be described clearly and completely in conjunction with the accompanying drawings of the embodiments of the present disclosure. Obviously, the described embodiments are a part of the embodiments of the present disclosure, but not all the embodiments. In the case of no conflict, the embodiments in the present disclosure and the features in the embodiments may be combined with each other. Based on the described embodiments of the present disclosure, all other embodiments obtained by those of ordinary skill in the art without creative work fall within the protection scope of the present disclosure.

Unless otherwise defined, the technical terms or scientific terms used in the present disclosure shall have the ordinary meanings understood by those of ordinary skill in the art to which the present disclosure belongs. The terms "first", "second" and similar words used in the present disclosure do not indicate any order, quantity or importance, but are only used to distinguish different components. Similar words such as "comprise" or "include" mean that the elements or objects appearing before the word cover the elements or objects listed after the word and their equivalents, but do not exclude other elements or objects.

It should be noted that the shape and size of each figure in the accompanying drawings do not reflect the true scale, and are merely intended to illustrate the contents of the present disclosure. The same or similar reference numerals indicate the same or similar elements or elements having the same or similar functions throughout.

The preparation process of micro light emitting diodes is to firstly thin, miniaturize and array a light emitting diode structure such that its size is only about 1 micrometer to 100 micrometers, and then the micro light emitting diode chips are transferred to a display substrate in batches and finally are packaged, wherein how to realize batch transfer is the key difficulty of this process, so that a mass transfer technology emerges at the right moment. The mass transfer technology is a technology for mounting the micro light emitting diode chips formed on a sapphire substrate to a circuit substrate in batches. Each micro light emitting diode chip corresponds to one sub-pixel on the display substrate. Due to the small size of the micro light emitting diode chips and the need for millions of sub-pixels on the display substrate, how to transfer the manufactured micro light emitting diode chips to the display substrate in batches with high efficiency, low cost and selectivity is a technical problem urgently needed to be solved by those skilled in the art.

Based on these, the embodiments of the present disclosure provide some mass transfer methods for micro light emitting diode chips to improve the transfer efficiency.

An embodiment of the present disclosure provides a mass transfer method for micro light emitting diode chips. As shown in FIG. 1, the mass transfer method may include the following steps.

Step S101: micro light emitting diode chips prepared on a sapphire substrate are bonded to a transfer substrate.

In some embodiments, before using a transfer substrate, a display substrate is firstly cleaned by using a water-methanol-propanol standard method, and then the following steps are implemented in sequence on the display substrate: gate metal Mo (200 nm) is deposited and patterned; a gate dielectric SiO2 (150 nm) is deposited; an active layer IGZO (40 nm) is deposited and patterned; source and drain metal Mo (200 nm) is deposited and patterned; a passivation layer SiO2 (300 nm) is deposited and patterned; and pixel electrodes Ti/Al/Ti (400 nm) are deposited, and Au (500 nm) is deposited thereon and patterned. The transfer substrate may be a transparent glass substrate. Subsequently, the micro light emitting diode chips prepared on the sapphire substrate are bonded by a temporary transfer adhesive disposed on a first base substrate of the transfer substrate, wherein the temporary transfer adhesive is specifically a wafer support system (WSS) adhesive which is of a two-layer structure including a release layer and an adhesive layer.

Step S102: the sapphire substrate is peeled off, and magnetic pole electroplating is performed on the micro light emitting diode chips which are obtained by peeling off the sapphire substrate, and corresponding magnetic poles grow at corresponding positions of the micro light emitting diode chips.

In some embodiments, the micro light emitting diode chips prepared on the sapphire substrate includes a buffer layer with a thickness ranging from 100 nm to 1 μm (for example, 3000 nm) deposited on the sapphire substrate, a negative terminal with a thickness of, for example, 800 nm, and a light emitting Layer with a thickness ranging from 100 nm to 500 nm, such as 180 nm and 250 nm, a positive terminal with a thickness such as 120 nm, a metal layer, such as Ni/Au and/or Ti/Au.

Figure 2:
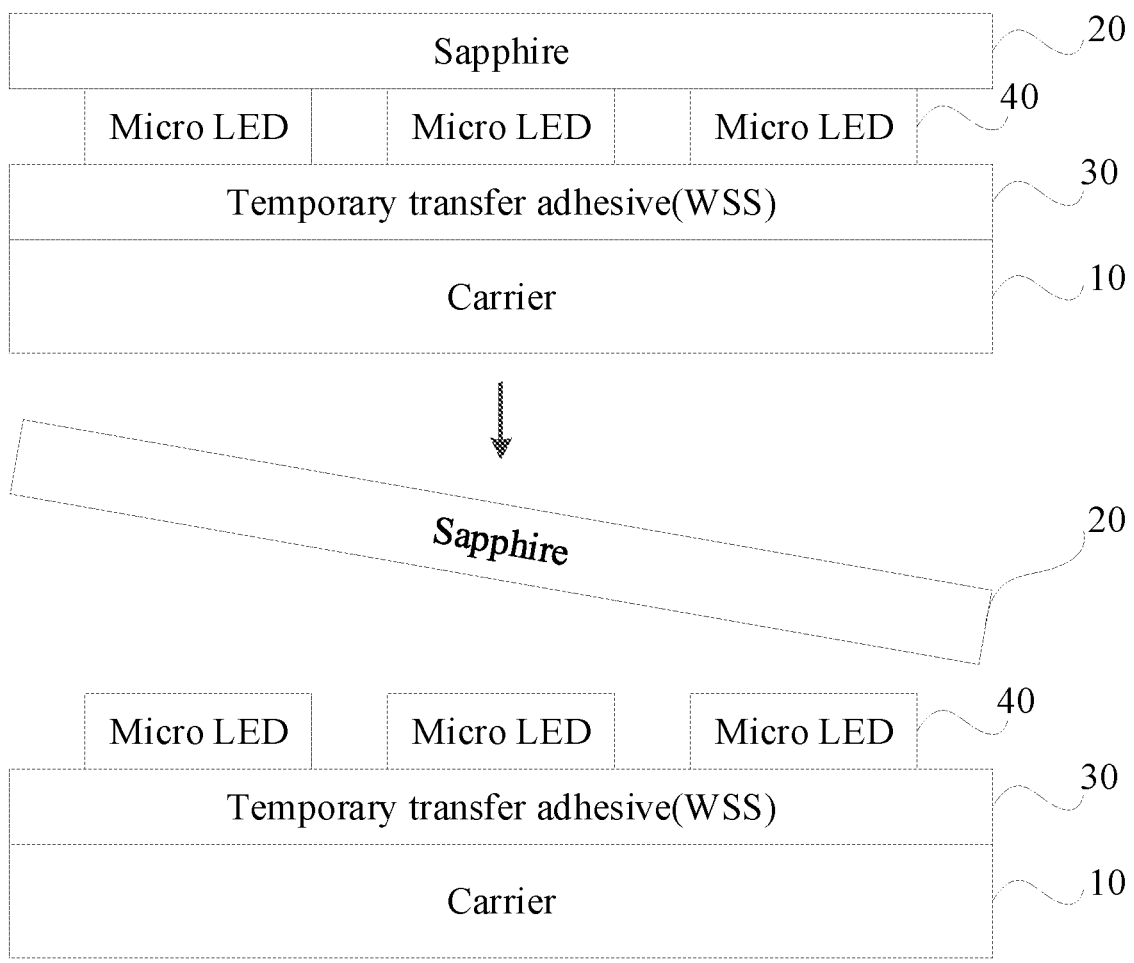
FIG. 2 is a schematic structural diagram corresponding to a process of bonding and peeling between a sapphire substrate and a transfer substrate in the mass transfer method of the micro light emitting diode chips provided by an embodiment of the present disclosure.

In some embodiments, after the micro light emitting diode chips prepared on the sapphire substrate are bonded to the transfer substrate, one side of the sapphire substrate is irradiated with a laser having a wavelength of 248 nm or 193 nm, thereby peeling off the sapphire substrate. FIG. 2 shows a schematic structural diagram corresponding to a process of bonding the transfer substrate (Carrier) and peeling the sapphire substrate (Sapphire), wherein in FIG. 2, 10 represents the transfer substrate, 20 represents the sapphire substrate, 30 represents the temporary transfer adhesive, and 40 represents the micro light emitting diode chips.

After the sapphire substrate is peeled off, in order to ensure the smooth progress of the subsequent manufacturing process, the peeling surfaces of the micro light emitting diode chips are cleaned with water or dilute hydrochloric acid.

Step S103: the transfer substrate is peeled off, and the micro light emitting diode chips obtained by peeling off the transfer substrate are placed in a dispersion liquid to form a solution in which the micro light emitting diode chips are dispersed, wherein any one of the dispersed micro light emitting diode chips includes the magnetic pole.

In some embodiments, one side of the transfer substrate is irradiated with a laser having a wavelength of 248 nm or 193 nm, thereby peeling off the transfer substrate. Then, the micro light emitting diode chips obtained by peeling off the transfer substrate are placed in the dispersion liquid. The dispersion liquid includes one or more of a silane coupling agent, methacryloyloxy silicon and methanol. The concentration of the dispersion liquid may be 5 wt %-30 wt %. In some embodiments, in order to increase the dispersion rate of granular micro light emitting diode chips, an operator may stir the dispersion liquid at a low speed, thereby forming the solution in which the micro light emitting diode chips are dispersed.

Step S104: soldering areas for accommodating the micro light emitting diode chips dispersed are formed on a display substrate.

The soldering areas formed by a patternable viscous adhesive for accommodating the dispersed micro light emitting diode chips are disposed on a base substrate of the display substrate at intervals. The soldering areas may be directly formed on the magnetic field shielding layer, or may be formed in the openings of the magnetic field shielding layer. Specifically, the steps S401-S402 mentioned herein can be referred. The magnetic field force required to attract the micro LEDs to the soldering areas in the condition that the soldering areas are directly formed on the magnetic field shielding layer is larger than that in the condition that the soldering areas are formed in the openings of the magnetic field shielding layer. Wherein the patterned viscous adhesive may be an SU8 adhesive, may be an Sn adhesive or may be an In adhesive. The specific value of the distance between adjacent soldering areas is an interval value set by those skilled in the art according to the actual demand for the display substrate, and the projection of the soldering areas on the base substrate of the display substrate and the projection of the micro light emitting diode chips on the base substrate of the display substrate may have the same shape. Generally, the display substrate is used to form a display panel, so that the display panel realizes a display function.

Step S105: under an action of a magnetic field force, the micro light emitting diode chips dispersed are placed in the soldering areas.

In the embodiment of the present disclosure, by performing the magnetic pole electroplating on the micro light emitting diode chips obtained by peeling off the sapphire substrate, the corresponding magnetic poles are generated at the corresponding positions of the micro light emitting diode chips. Then, the transfer substrate is peeled off, and the micro light emitting diode chips obtained by peeling off the transfer substrate are placed in the dispersion liquid, thereby forming the solution in which the micro light emitting diode chips are dispersed. Then, under the action of the magnetic field force, the dispersed micro light emitting diode chips are automatically adsorbed to the designated positions of the soldering areas of the display substrate, thereby a large number of micro light emitting diodes can be transferred to the display substrate.

In the embodiment of the present disclosure, with reference to FIG. 3, the step S102 that the sapphire substrate is peeled off, and magnetic pole electroplating is performed on the micro light emitting diode chips obtained by peeling off the sapphire substrate to enable corresponding magnetic poles to be generated at corresponding positions of the micro light emitting diode chips specifically includes the following steps.

Step S201: patterning a photoresist on a side, where the micro light emitting diode chips are attached, of the transfer substrate obtained by peeling off the sapphire substrate to form a first photoresist patterned.

Step S202: depositing conductive layers in the area defined by the first photoresist to form electrodes for electroplating.

Step S203: placing the micro light emitting diode chips deposited the conductive layers in an electrolyte, and generating corresponding patterned magnetic poles at corresponding positions of the conductive layers depositing on the micro light emitting diode chips.

In some embodiments, the specific realization process of the step S201 to the S203 is as follows.

Figure 4:
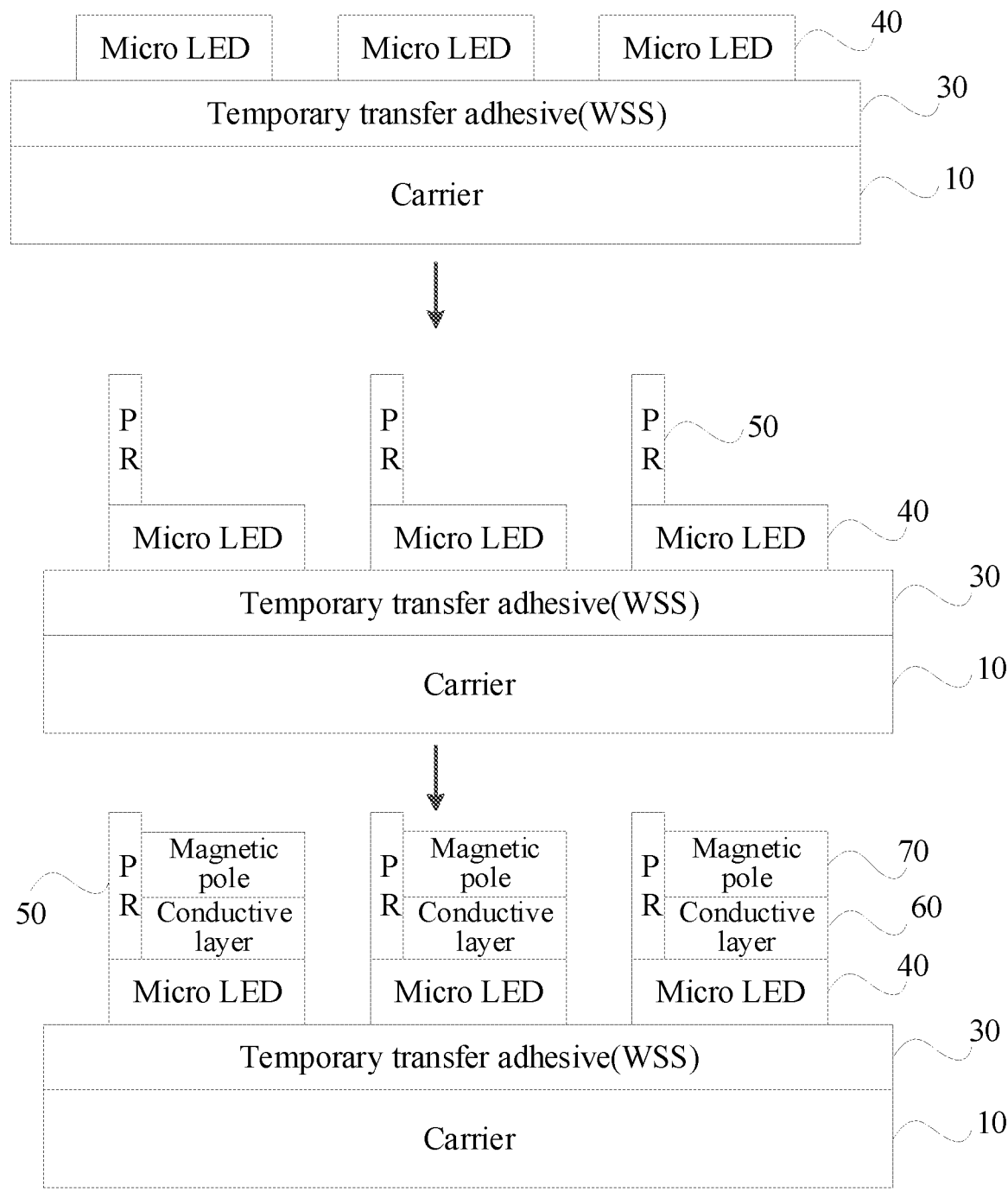
FIG. 4 is a schematic structural diagram corresponding to a process of growing magnetic poles on micro light emitting diode chips in the mass transfer method of the micro light emitting diode chips provided by an embodiment of the present disclosure.

Firstly, after the sapphire substrate is peeled off, the photoresist (for example, PR adhesive) patterning is performed on the side of the transfer substrate where the micro light emitting diode chips are attached to form the first photoresist patterned. Then, the conductive layers are deposited in the area defined by the first photoresist to form the electrodes for electroplating, wherein the conductive layers include Ti (30 nm)/Cu (300 nm). Then, the transfer substrate deposited the conductive layers is placed in the electrolyte, and the patterned magnetic poles are generated at the corresponding positions of the conductive layers of the micro light emitting diode chips. Still taking the structural schematic diagram shown in FIG. 2 as an example, FIG. 4 is a schematic structural diagram corresponding to a process of generating magnetic poles 70 on micro light emitting diode chips 40 by Steps S201 to S203, wherein 50 represents the first photoresist patterned, and 60 represents the conductive layers.

In some embodiments, the material of themagnetic pole may be CoNiMnP. In order to generate the patterned magnetic pole on the surfaces of the conductive layers better, a pH value of the electrolyte is 3-4, a current density is 8 mA/cm$^2$, and an electroplating current duty cycle is 66.6%. In some embodiments, the electrolyte may be prepared according to eight electrolyte components as shown in Table 1.

TABLE 1

| Electrolyte Component | g/L (grams per liter) |
| --- | --- |
| $CoCl_2 \cdot 6H_2O$ (cobalt chloride) | 24 |
| $NiCl_2 \cdot 6H_2O$ (nickel chloride) | 24 |
| $MnSO_4 \cdot H_2O$ (manganese sulfate) | 3.4 |
| $NaH_2PO_2$ (sodium hypophosphite) | 4.4 |
| $H_3BO_3$ (boric acid) | 25 |
| NaCl (sodium chloride) | 24 |
| $C_{12}H_{25}O_4NaS$ (electrophoresis-grade sodium dodecyl sulfate) | 0.3 |
| Saccharin (saccharin sodium) | 0.4 |

Figure 5:
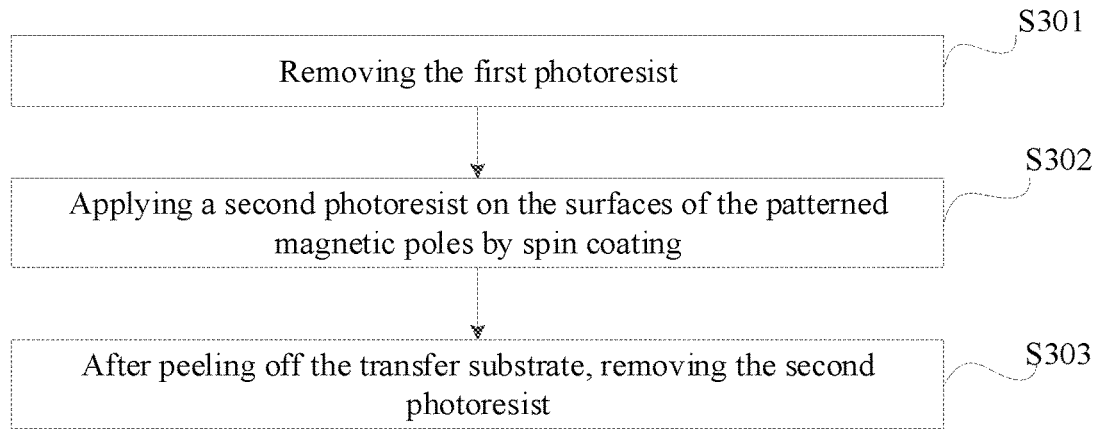
FIG. 5 is a method flowchart before S103 in the mass transfer method of the micro light emitting diode chips provided by an embodiment of the present disclosure.

In the embodiment of the present disclosure, with reference to FIG. 5, before the Step S103 of placing the micro light emitting diode chips obtained by peeling off the transfer substrate in the dispersion liquid, the method further includes the following steps.

Step S301: removing the first photoresist.

Step S302: applying a second photoresist on the surfaces of the patterned magnetic poles by spin coating.

Step S303: after peeling off the transfer substrate, removing the second photoresist.

In some embodiments, the specific realization process of the steps S301 to S303 is as follows.

After the patterned magnetic poles are generated at the corresponding positions of the conductive layers of the micro light emitting diode chips, in order to realize granulation of the micro light emitting diode chips, the first photoresist on the micro light emitting diode chips is firstly removed, and then the second photoresist (for example, AZ5214) is applied on the surfaces of the patterned magnetic poles by spin coating. A thickness of the second photoresist is 5 μm. When the transfer substrate is irradiated with the laser, the micro light emitting diode chips are protected from damage by the second photoresist. After the transfer substrate is peeled off through the laser irradiation, the second photoresist is removed by a Stripe solution.

Figure 6:
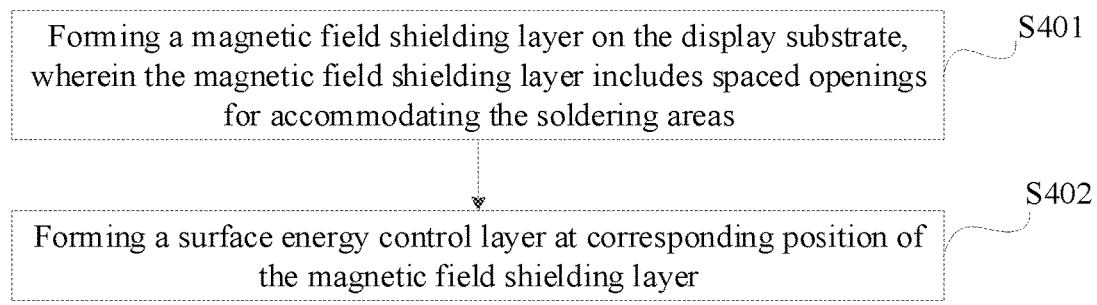
FIG. 6 is a method flowchart after forming soldering areas for accommodating the dispersed micro light emitting diode chips on a display substrate in the mass transfer method of the micro light emitting diode chips provided by an embodiment of the present disclosure.

As shown in FIG. 6, after forming the soldering areas for accommodating the dispersed micro light emitting diode chips on the display substrate, the method further includes the following steps.

Step S401: forming a magnetic field shielding layer on the display substrate, wherein the magnetic field shielding layer includes spaced openings for accommodating the soldering areas.

Step S402: forming a surface energy control layer at corresponding position of the magnetic field shielding layer.

After the step S401, the step S104 may specifically be: forming the soldering areas patterned in the openings.

The soldering areas may be formed by the patternable viscous adhesive. The patterned viscous adhesive may be an SU8 adhesive, may be an Sn adhesive or may be an In adhesive. The surfaces of the soldering areas are hydrophilic.

The magnetic field shielding layer may be Al/Fe alloy. In some embodiments, the magnetic field shielding layers may be patterned by photolithography. In some embodiments, the magnetic field shielding layer can generate a magnetic field shielding effect, so that the soldering areas on the base substrate of the display substrate are hydrophilic to the solution in which the micro light emitting diode chips are dispersed. Then, the surface energy control layer is formed at the corresponding position of the magnetic field shielding layer. Specifically, PTFE (100 nm) may be deposited by spray coating and etched to form the patterned surface energy control layer. Wherein the surface energy control layer may be the PTFE layer shown in FIG. 7. In addition, the patterned surface energy control layer may also be formed by photolithography, or the patterned surface energy control layer may also be formed by a wet process. Of course, those skilled in the art may use different technologies to realize the design of the patterned magnetic field shielding layers according to actual needs. In some embodiments, since the surface of the surface energy control layer is hydrophobic to the solution in which the micro light emitting diode chips are dispersed and the soldering areas are hydrophilic to the solution in which the micro light emitting diode chips are dispersed, so that the targeted selection on the micro light emitting diode chips is realized, thereby effectively improving the efficiency of picking up the micro light emitting diode chips dispersed by to-be-bonded areas for the micro light emitting diode chips on the display substrate.

Figure 7:
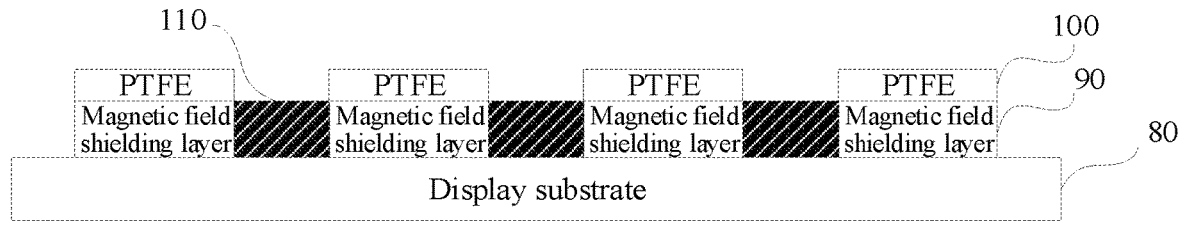
FIG. 7 is a schematic structural diagram of the display substrate in the mass transfer method of the micro light emitting diode chips provided by an embodiment of the present disclosure.

In the embodiment of the present disclosure, FIG. 7 shows a schematic structural diagram of sequentially disposing the patterned magnetic field shielding layer 90 and the surface energy control layer 100 on the display substrate 80 by the steps S401 to S402, wherein 110 represents the soldering areas.

In the embodiment of the present disclosure, after forming the solution in which the micro light emitting diode chips are dispersed, the method further includes: under the action of hydrophobicity of PTEE layer, i.e. the surface energy control layer 100, hydrophilicity of the soldering areas and magnetic field shielding of the magnetic field shielding layer patterned, the micro light emitting diode chips dispersed move toward the soldering areas under the magnetic field force.

In some embodiments, specifically, the display substrate may be placed in a methanol fluidized bed with a concentration of 5 wt %-30 wt %, and the corresponding magnetic field force is provided by a SmCo permanent magnet disposed outside the display substrate, so that the granular dispersed micro light emitting diode chips including the magnetic poles are attracted, thereby the dispersed micro light emitting diode chips move toward the soldering areas, wherein by adjusting the distance between the permanent magnet and the display substrate, the magnitude of the attraction force of the permanent magnet to the micro light emitting diode chips can be controlled.

The SmCo permanent magnet may be part of the mass transfer device described below. The permanent magnet may be arranged on the side of the display substrate away from the Micro LED chips. For example, the N pole of the permanent magnet faces the display substrate, and the S poles of the magnetic poles in the Micro LED chips face the Micro LEDs. At this time, the N pole of the permanent magnet and the S poles of the magnetic poles in the Micro LED chips attract each other, and then the Micro LED chips dispersed move to the soldering areas. Alternatively, the SmCo permanent magnet can be arranged on the side of the display substrate facing the Micro LED chips. The Micro LED chips are located in the dispersion and between the permanent magnet and the display substrate. For example, the N pole of the permanent magnet faces the display substrate, and the S poles of the magnetic poles in the Micro LED chips face the Micro LED. At this time, the N pole of the permanent magnet and the N poles of the magnetic poles in the Micro LED repel each other, and then the micro LED chips dispersed move to the soldering area. Of course, the position and magnetic pole direction of the SmCo permanent magnet can also be modified in other ways, as long as the dispersed micro-light-emitting diode chips can be controlled to move to the soldering area, which will not be repeated here.

In the embodiment of the present disclosure, in order to increase the bonding rate of the micro light emitting diode chips in the soldering areas and efficiently pick up the micro light emitting diode chips by the display substrate, after placing the dispersed micro light emitting diode chips in the soldering areas, the method further includes: curing the patternable viscous adhesive by a thermocuring process, and fixing the micro light emitting diode chips.

In some embodiments, after the micro light emitting diode chips move to the soldering areas, the display substrate is heated to 120° C. Thus, while the methanol solution on the surface of the display substrate is evaporated, the patternable viscous adhesive is cured, and the micro light emitting diode chips are fixed, thereby realizing efficient transfer for the micro light emitting diode chips.

In the embodiments of the present disclosure, based on the same inventive concept, an embodiment of the present disclosure provides a mass transfer device, configured to transfer micro light emitting diode chips dispersed peeling off from a transfer substrate to a display substrate according to the mass transfer method of the micro light emitting diode chips according to claim 1, wherein: the transfer substrate is configured to bond the micro light emitting diode chips prepared on a sapphire substrate.

In some embodiments, the display substrate is configured to pick up the dispersed micro light emitting diode chips under the action of the magnetic field force.

In some embodiments, the processing device may include the permanent magnet mentioned herein and any device capable of growing magnetic pole on the micro light emitting diode chip.

In the embodiment of the present disclosure, the mass transfer device further includes a cavity containing a dispersion fluidized bed, such as a methanol fluidized bed. A concentration of the dispersion liquid may be 5 wt %-30 wt %. the dispersion liquid comprises one or more of a silane coupling agent, methacryloyloxy silicon or methanol.

The related realization processes of the mass transfer technology of the micro light emitting diode chips provided by the embodiments of the present disclosure have been described in detail above, which will not be repeated herein one by one.

Figure 8:
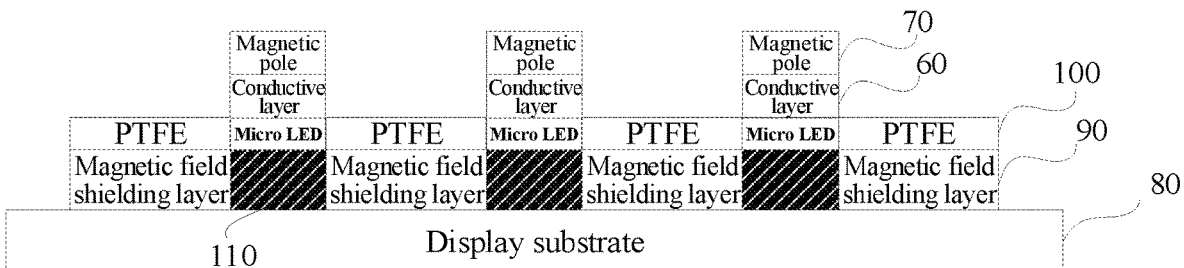
FIG. 8 is a schematic structural diagram of a display panel including the micro light emitting diode chips obtained by the mass transfer method provided by an embodiment of the present disclosure.

In the embodiments of the present disclosure, based on the same inventive concept, an embodiment of the present disclosure provides a display panel as shown in FIG. 8, including:
a display substrate 80;
a magnetic field shielding layer 90 formed on the display substrate 80, wherein the magnetic field shielding layer 90 comprises spaced openings;
soldering areas 110 formed in the openings, wherein the soldering areas 110 are formed of a patternable viscous adhesive; and
a micro light emitting diode chip 40 formed on each of the soldering areas 110;
a magnetic pole 70 formed on a side of the micro light emitting diode chip 40 away from the display substrate 80.

The display substrate 80 further includes a surface energy control layer, which is hydrophobic, formed on a corresponding position of the magnetic field shielding layer, and a conductive layer 60 between the micro light emitting diode chip 40 and the magnetic pole 70. The surfaces of the soldering areas 110 are hydrophilic.

In the embodiment of the present disclosure, the magnetic poles are generated at the corresponding positions of the micro light emitting diode chips obtained by peeling off the sapphire substrate. Then, the transfer substrate is peeled off, and the micro light emitting diode chips obtained by peeling off the transfer substrate are placed in the dispersion liquid, thereby forming the solution in which the dispersed micro light emitting diode chips are dispersed. Then, under the action of the magnetic field force, the display substrate picks up the dispersed micro light emitting diode chips, thereby realizing the transfer of a large number of micro light emitting diodes to the display substrate.

Obviously, those skilled in the art can make various modifications and variations to the present disclosure without departing from the spirit and scope of the present disclosure. Thus, if these modifications and variations of the present disclosure fall within the scope of the claims of the present disclosure and the equivalent technologies thereof, the present disclosure is also intended to include these modifications and variations.

What is claimed is:

1. A mass transfer method for micro light emitting diode chips, comprising the following steps:
bonding micro light emitting diode chips prepared on a sapphire substrate to a transfer substrate;
peeling off the sapphire substrate;
performing magnetic pole electroplating on the micro light emitting diode chips obtained by peeling off the sapphire substrate to enable corresponding magnetic poles to be generated at corresponding positions of the micro light emitting diode chips;
peeling off the transfer substrate;
placing the micro light emitting diode chips obtained by peeling off the transfer substrate in a dispersion liquid to form a solution comprising the micro light emitting diode chips dispersed in the dispersion liquid, wherein a respective one of the micro light emitting diode chips dispersed dispersion liquid comprises a respective one of the magnetic poles;

forming soldering areas for accommodating the micro light emitting diode chips dispersed in the dispersion liquid on a display substrate; and placing the micro light emitting diode chips, which are dispersed in the dispersion liquid, in the soldering areas under an action of a magnetic field force;

wherein the performing magnetic pole electroplating on the micro light emitting diode chips obtained by peeling off the sapphire substrate to enable the corresponding magnetic poles to be generated at the corresponding positions of the micro light emitting diode chips comprises:

patterning a photoresist on a side, where the micro light emitting diode chips are attached, of the transfer substrate obtained by peeling off the sapphire substrate to form a first photoresist patterned;

depositing conductive layers in the area defined by the first photoresist to form electrodes for electroplating; and placing the micro light emitting diode chips deposited the conductive layers in an electrolyte, and generating corresponding patterned magnetic poles at corresponding positions of the conductive layers depositing on the micro light emitting diode chips.

2. The method according to claim 1, wherein before placing the micro light emitting diode chips obtained by peeling off the transfer substrate in the dispersion liquid, the method further comprises:

removing the first photoresist;

applying a second photoresist on surfaces of the patterned magnetic poles by spin coating; and after peeling off the transfer substrate, removing the second photoresist.

3. The method according to claim 1, wherein the forming soldering areas for accommodating the micro light emitting diode chips dispersed in the dispersion liquid on the display substrate comprises:

disposing the soldering areas formed by a patternable viscous adhesive for accommodating the dispersed micro light emitting diode chips according to a preset interval on a base substrate of the display substrate.

4. The method according to claim 3, wherein after forming the soldering areas for accommodating the dispersed micro light emitting diode chips dispersed in the dispersion liquid on the display substrate, the method further comprises:

forming a magnetic field shielding layer on the display substrate, wherein the magnetic field shielding layer comprises spaced openings for accommodating the soldering areas.

5. The method according to claim 4, the forming soldering areas for accommodating the micro light emitting diode chips dispersed in the dispersion liquid on a display substrate comprises:

forming the soldering areas patterned in the openings.

6. The method according to claim 4, further comprises:

forming a surface energy control layer at corresponding position of the magnetic field shielding layer.

7. The method according to claim 6, wherein after forming the solution comprising the micro light emitting diode chips dispersed, the method further comprises:

under hydrophobicity of the surface energy control layer, hydrophilicity of the soldering areas, and magnetic field shielding of the magnetic field shielding layer, controlling the micro light emitting diode chips dispersed to move toward the soldering areas by the magnetic field force.

8. The method according to claim 7, wherein after placing the micro light emitting diode chips, which are dispersed in the dispersion liquid, in the soldering areas, the method further comprises:

curing the patternable viscous adhesive by a thermocuring process; and fixing the micro light emitting diode chips dispersed.

9. The method according to claim 1, wherein the dispersion liquid comprises one or more of a silane coupling agent, methacryloyloxy silicon or methanol.

10. The method according to claim 1, wherein a pH value of the electrolyte is 3 to 4, a current density is 8 mA/cm$^2$, and an electroplating current duty cycle is 66.6%.

11. A mass transfer device, configured to transfer micro light emitting diode chips dispersed peeling off from a transfer substrate to a display substrate according to the mass transfer method of the micro light emitting diode chips according to claim 1, wherein:

the transfer substrate is configured to bond the micro light emitting diode chips prepared on a sapphire substrate.

12. The mass transfer device according to claim 11, further comprising:

a cavity containing a dispersion fluidized bed.

13. The mass transfer device according to claim 12, wherein:

the dispersion fluidized bed is methanol fluidized bed.

14. The mass transfer device according to claim 12, wherein:

a concentration of a dispersion liquid is 5 wt %-30 wt %.

15. The mass transfer device according to claim 11, wherein:

the display substrate is configured to pick up the micro light emitting diode chips dispersed under the action of the magnetic field force.

16. A display panel, comprising:

a display substrate;

a magnetic field shielding layer formed on the display substrate, wherein the magnetic field shielding layer comprises spaced openings;

soldering areas formed in the openings, wherein the soldering areas are formed of a patternable viscous adhesive;

a micro light emitting diode chip formed on each of the soldering areas;

a magnetic pole formed on a side of the micro light emitting diode chip away from the display substrate; and a surface energy control layer, which is hydrophobic, formed on a corresponding position of the magnetic field shielding layer.

17. The display substrate according to claim 16, wherein:

surfaces of the soldering areas are hydrophilic.

18. The display panel according to claim 16, further comprising:

a conductive layer between the micro light emitting diode chip and the magnetic pole.

* * * * *